United States Patent
Schulz et al.

(10) Patent No.: US 6,830,778 B1
(45) Date of Patent: Dec. 14, 2004

(54) DIRECT PRINTING OF THIN-FILM CONDUCTORS USING METAL-CHELATE INKS

(75) Inventors: Douglas L. Schulz, Billerica, MA (US); Calvin J. Curtis, Lakewood, CO (US); David S. Ginley, Evergreen, CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 10/088,760

(22) PCT Filed: Jan. 5, 2001

(86) PCT No.: PCT/US01/00430

§ 371 (c)(1),
(2), (4) Date: Mar. 21, 2002

(87) PCT Pub. No.: WO01/54203

PCT Pub. Date: Jul. 26, 2001

(30) Foreign Application Priority Data

Jan. 21, 2000 (WO) .................. PCT/US00/01432

(51) Int. Cl.[7] .................. B05D 5/12; B05D 3/02
(52) U.S. Cl. .................. 427/123; 427/125; 427/226; 427/229
(58) Field of Search .................. 427/58, 123, 125, 427/226, 229

(56) References Cited

U.S. PATENT DOCUMENTS

| | | | |
|---|---|---|---|
| 4,599,277 A | | 7/1986 | Brownlow et al. |
| 5,176,744 A | * | 1/1993 | Muller .................. 106/1.26 |
| 5,281,635 A | * | 1/1994 | Bishop .................. 524/93 |
| 5,316,796 A | * | 5/1994 | Awaya et al. .................. 427/252 |
| 5,474,800 A | * | 12/1995 | Matsuzaki .................. 427/115 |
| 5,597,614 A | * | 1/1997 | Noguchi et al. .................. 427/162 |
| 5,882,722 A | * | 3/1999 | Kydd .................. 427/96 |

OTHER PUBLICATIONS

PCT Notification of Transmittal of the International Search Report or the Declaration, PCT/US01/00430, mailed Jul. 17, 2002.

International Publication No. WO 99 19900 A (Patterning Technologies Ltd., Speakman, Stuart (GB); Thin Film Techn) Apr. 22, 1999.

Teng, KF et al., "Ink Jet Assisted Metallization for Low Cost Flat Plate Solar Cells," Photovoltaic Specialists Conf. New Orleans, May 4–8, 1987, New York, IEEE, US vol. Conf. 19, pp. 1430–1434.

Teng, KF et al., "Application of Ink Jet Technology on Photovoltaic Metallization," IEEE Electron Device Letters, New York, US, vol. 9, No. 11, Nov. 1, 1988, pp. 591–593.

Hybertson, BM et al., "Deposition of Palladium Films by a Novel Supercritical Fluid Transport–Chemical Deposition Process," Materials Research Bulletin, Elsevier Science Publishing, New York, US, vol. 26, No. 11, Nov. 1, 1991, pp. 1127–1133.

* cited by examiner

Primary Examiner—Brian K. Talbot
(74) Attorney, Agent, or Firm—Paul J. White

(57) ABSTRACT

A process for forming an electrical conductor on a substrate is provided, consisting essentially of providing an ink comprised of a metallic chelate, printing directly thereon the ink, and decomposing the ink wherein the metal-chelate is converted to a solid metal conductor on the substrate.

22 Claims, 4 Drawing Sheets

US 6,830,778 B1

DIRECT PRINTING OF THIN-FILM CONDUCTORS USING METAL-CHELATE INKS

TECHNICAL FIELD

This invention relates to electrical conductors, and in particular to a process of forming thin-film metal conductors on a substrate by directly printing thereon metal chelate inks and decomposing the inks.

BACKGROUND ART

Thin metal films have a wide variety of applications ranging from interconnects in semiconductor device manufacture, including particle based contacts to photovoltaic semiconductors, to the optical tailoring of glass monoliths and to gas permeable membranes in separations technology. As a result, conventional processes have looked toward optimizing process design and in the synthesis of new inorganic, metal-organic and organometallic compounds specifically for use as thin film precursor materials. Optimization desirably includes providing high purity films of acceptable conductivity while eliminating conventional processing steps in order to reduce costs. It is also desirable to eliminate the photolithography and mask preparation steps used in screen printing and vacuum application, both of which are not conformal. In particular, inks which are amenable to low temperature deposition, such as ink jet printing, screen printing and other direct write approaches, are desirable in order to eliminate the use of costly vacuum application systems. Low temperature deposition is also desirable in the formation of semiconductors, particle-based contacts to photovoltaic semiconductors, and in spray printing on conformal substrates, such as flexible circuit boards, because high-temperature sintering cannot be performed due to thermal limitations associated with the underlying layers. For example, the thermal treatment of a Ni contact onto a ZnO conducting layer, as the top layer in a CuInSe$_2$ ("CIS") solar cell, is limited to ~200° C. for 2 minutes because of the thermal instability of the underlying solar cell device. It has also been found that when a 1,2-propanediol slurry of Ni powder is deposited onto a conducting ZnO film and annealed in air at 200° C. for 2 minutes, the resultant Ni contact becomes crumbly in structure and is not electrically conductive. Moreover, the demand for improved performance in integrated circuits has led to integration of an increasing number of semiconductor devices on chips of decreasing size. This has been achieved by scaling down the device feature size, while increasing the number of interconnect layers. As a result, the topography has become much more severe with each successive device generation. In addition, as metal linewidths shrink, device speed is expected to be limited by the interconnect performance.

Copper is a widely applied electronic material with low bulk resistivity of ~2 $\mu\Omega$·cm. Many direct write approaches, to the formation of copper conductors, are limited by impurity phase formation. For example, copper (II) carboxylate analogs to Ag(neodecanoate) produce copper oxide when heated to decomposition in air. Most Cu(II) precursor chemistries, however, require relatively high-temperatures (e.g., Cu(hfa)$_2$ yields Cu at 340–400° C.) or subsequent processing in the presence of a reducing species (e.g., hydrogen gas) to produce metallic layers. The chemistry of Cu(I) complexes, as chemical-vapor-deposition precursors to Cu films, has also been evaluated for use in the next-generation ultra-large scale integrated circuits. Copper (I) complexes, based on Cu(hfa).L (where hfa-hexafluoroacetylacetonate and L=CO, phosphine, alkene, or alkyne), have been shown, conventionally, to produce copper films by chemical vapor deposition ("CVD") at low temperature (100–150° C.) with resistivities approaching that of bulk copper.

The CVD process using aerosol precursors for the application of metal alloy thin films has been described for low temperature deposition on a variety of substrates. In Xu, C., et al., *Chem. Mater.* 1995, 7, 1539–1546, the CVD of Ag—Pd, Cu-Pd, and Ag—Cu alloys using aerosol precursor delivery over a range of preheating temperatures (70–80 ° C.) and substrate temperatures (250–300° C.) is disclosed. There, the precursors (hfac)Ag(SEt$_2$), (hfac)Cu$^1$(1,5-COD), Cu(hfac)$_2$, Pd(hfac)$_2$ and Pd(hfac)$_2$(SEt$_2$), dissolved in toluene with 10% H$_2$ in Ar as carrier gas, are used in the CVD process, a combination, which the authors claim provides advantages over traditional methods. These advantages include higher deposition rates, the ability to transport thermally sensitive compounds, and the reproducible deposition of binary materials. See also, Jain, A., et al., *J. Vac. Sci. Technol.* B 11(6), Nov/Dec. 1993, 2107–2113 ((CVD of copper on both SiO$_2$ and W from (hfac)CuL, where hfac= 1,1,1,5,5,5-hexafluoroacetylacetonate, and L=1,5, COD or vinyltrimethylsilane (VTMS)); and Norman, J. A. T., et al., *Journal De Physique* IV, Colloque C2, suppl. *Au Journal de Physique* II, Vol. 1, September 1991, 271–277 ((CVD of the volatile liquid complex Cu$^{+1}$(hexafluoroacetylacetonate) trimethylvinylsilane, [Cu$^{+1}$(hfac)TMVS])).

In an aerosol-assisted CVD process, the precursor is first dissolved in a solvent. The solution is passed through an aerosol generator, where micron-sized aerosol droplets are generated in a carrier gas and are transported into a preheating zone where both the solvent and the precursor evaporate. The precursor vapor reaches the heated substrate surface where thermally induced reactions and film deposition takes place. This method may be employed on a variety of mask-based substrates. However, distinct disadvantages of the CVD process have heretofore included a necessity to mask the substrate for deposition, the resulting large-grain-microstructures (e.g., 0.1 $\mu$m to 0.6 $\mu$m) of the film, and the fact that the deposition rate is precursor evaporation-rate limited in the sense that the deposition rate is related to the partial pressure of the precursor which is fixed by the vapor pressure. These limitations and others, such as the inefficient use of expensive precursor materials, inherent in the CVD process, render it incapable of forming linewidths in the range of 130 $\mu$m, or less, at high deposition rates without increasing the deposition temperature.

Screen printing using metal powders and metallo-organic decomposition (MOD) compounds has also been used for metallization. For example, U.S. Pat. No. 5,882,722 describes the use of screen printable metal powders and MOD products to print thick films at low temperature. The thick films are formed of a mixture of metal powders and metallo-organic decomposition (MOD) compounds in an organic liquid vehicle in a two-step screen-print and heat process. The mixtures contain a metal flake with a ratio of the maximum dimension to the minimum dimension of between 5 and 50. The vehicle may include a colloidal metal powder with a diameter of about 10 to about 40 nanometers. The concentration of the colloidal metal in the suspension can range from about 10% to about 50% by weight. The MOD compound begins to evaporate at a temperature of approximately about 200° C. and then consolidation of the metal constituents and bonding to the substrate is completed at temperatures less than 450° C., in a time less than six minutes.

Direct printing, using a spray or ink jet process, however, necessitates the formulation of inks which are substantially different from those formulations which are currently used in screen printing applications. Unlike screen printable inks, the viscosity of these inks must be at or near that of water, in order to permit printing with piezoelectric or thermal ink jet systems and to prevent agglomeration of the ink on the substrate. There is also no need to have the printed line be free standing or for the ink to include binders, and the like. Volatility of these inks should also be low enough to prevent consequential solvent loss at low temperature but high enough to be readily lost when applied at the substrate temperature.

The use of metal organic precursor materials, either with or without metallic particles, for use in a process to directly write conducting metal layers or grids, using a non-vacuum deposition technique, such as spray or ink-jet application, would greatly simplify the process of applying metal films, due to a reduction in capital outlay and material costs. Ink-jet printing, for example, is also advantageous in its ability to yield very narrow grid lines with a corresponding efficient use of precursor materials, in contrast to screen printing, and a decrease in shading losses on a variety of substrates. As related to solar cells, these advantages can translate directly into cells having an increase in cell efficiency.

In direct writing, ink precursor chemistries are chosen according to the requirements of the device of interest. For example, it has been shown that Ag(neodecanoate) in xylene can be used as a precursor for ink-jet deposition of ~130 $\mu$m-wide Ag grids in Si solar cells. Teng, K. F. et al., *IEEE Electron Device Lett.* 1988, 9, 591. A post-deposition anneal in air at 350° C. has also yielded Ag conductors with reasonable electrical properties ($\rho$~100 $\mu\Omega\cdot$cm). The high temperature anneal step, however, is not amenable for use in other grid metallizations, such as for $CuInSe_2$ solar cells, where temperatures in excess of 200° C. substantially degrade the diode properties of the heterojunction owing to solid state diffusion and oxidation, or both. None of the foregoing descriptions therefore enable the use of ink precursor metal chelate compounds in a direct write process for producing fine grain electrical conductors on a substrate. Such a process would desirably reduce the number of rate-limiting steps, and allow for the low temperature deposition of finely sized metal conductors capable of narrow linewidths with adequate conductivity.

DISCLOSURE OF THE INVENTION

In view of the foregoing considerations, it is the object of the present invention to provide a process for the use of metal chelates in a direct write process of forming thin-film conductors which are useful in microelectronics, solar conversion technologies, and the like, and which are characterized by good interparticle structural connectivity and electrical conduction.

Another object of the invention is to provide a direct write process for spray or ink jet printing of a copper, silver, aluminum, or gold electronic contact lines on a glass or polymer substrate.

It is yet another object of the present invention to provide a direct write method for forming a metallic film having electrical conductivity and structural connectivity in CIS solar cells.

It is yet another object of the present invention to provide a Ni film having electrical conductivity and structural connectivity to a ZnO layer in CIS solar cells.

These and other objects of the present invention will become apparent throughout the description of the invention which now follows.

Briefly, the present invention provides a process for forming an electrical conductor on a substrate, consisting essentially of providing an ink comprised of a metallic chelate, printing directly thereon the ink, and decomposing the ink wherein the metal-chelate is converted to a solid metal conductor on the substrate.

Unless specifically defined otherwise, all technical or scientific terms used herein have the same meaning as commonly understood by one of ordinary skill in the art to which this invention belongs. "Direct printing" and "printing directly" means printing an ink on a substrate using a pressurized jet, dip pen, spray, or nanotube printing. "Conformal substrate" means spray printing of metal coatings on flexible substrates, such as flexible circuit boards. Although any methods and materials similar or equivalent to those described herein can be used in the practice or testing of the present invention, the preferred methods and materials are now described.

BRIEF DESCRIPTION OF THE DRAWINGS

Reference now will be made in detail to the presently preferred embodiments of the invention, examples of which are illustrated in the accompanying drawings.

BEST MODE FOR CARRYING OUT THE INVENTION

Figure 1:
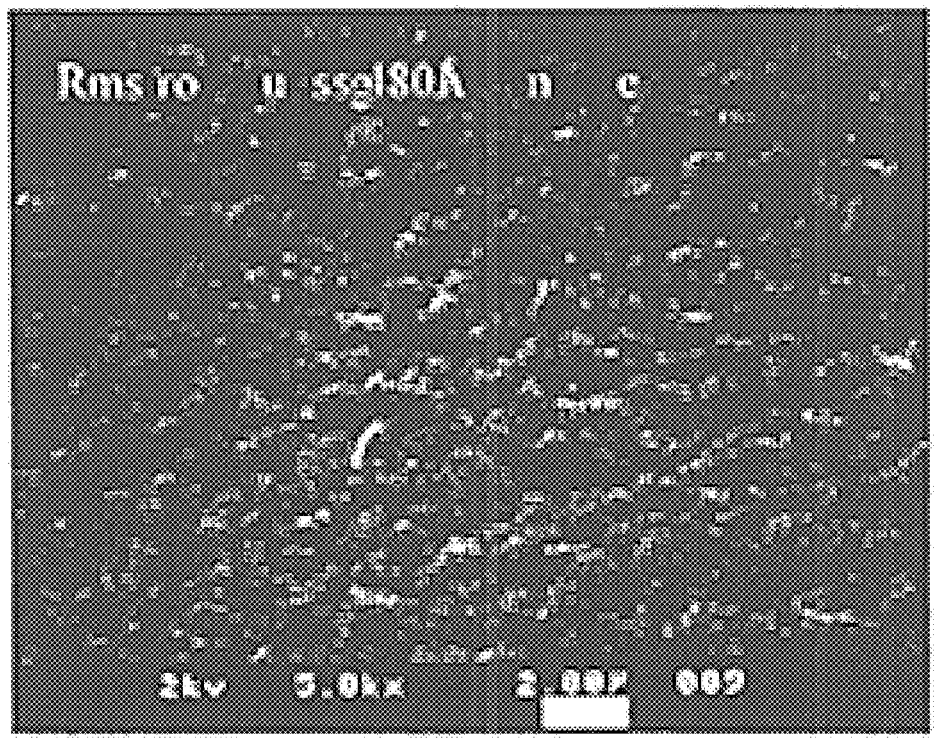
FIG. 1 shows scanning electron microscope ("SEM") images of Ag films sprayed on glass and Si substrates at an elevated temperature of 400° C.

The present invention provides a simple two step print and decompose process for forming metal conductors, wherein decomposition consolidates a metal chelate precursor ink, with or without metal nanoparticles, into the conductor at a low temperature.

The inks in accordance with the present invention are metal chelate organometallic complexes which decompose for direct consolidation of thin film metal conductors, with or without metal powders, and bonding on or between a variety of substrates. The metal complexes are pure synthetic compounds which decompose cleanly at low temperature to consolidate the metal as a metallic element or oxide, depending on the metal and the atmosphere. The metal-chelates are preferably selected from a group consisting of metal $\beta$-diketonates, metal armides, metal organometallics and metal alkoxides. Examples of such metal chelates include the organometallic complexes Cu(hfa).(cyclooctadiene), Cu(hfa).VTMS, $[Ag(hfa)]_2.H_2O$, Ag(hfa).

tetraglyme, [Ag(hfa)(diglyme)]$_2$, Ni(cyclooctadiene)$_2$, Ag(hfa)(COD), Ag(hfa)(SEt$_2$), and ethyl (trimethlyphosphine)gold(I), where hfac=1,1,1,5,5,5-hexafluoroacetylacetonate, and COD=1,5, cyclooctadiene, and VTMS is vinyltrimethylsilane. VTMS also has the advantage of stabilizing the chelate in the formation of the complex.

Metal nanoparticles, may, but need not be included with the complex in the formation of the ink. Preferably, when used, the metal particles have a mean particle diameter in the range of 1 to 500 nanometers, and more particularly in the range of I and 100 nanometers. The nanoparticles may be produced according to any method well known in the art, such as the Argonide Corporation's, Sanford, Fla., nano silver particles, which are formed by electro-explosion of Ag wire. When used, the metal chelate acts as a glue for the metal particles in the consolidation of the conducting matrix and provides flexibility in the formulation of the complex such as in controlling the film thickness or for printing compound materials and alloys. When applied in the field of polycrystalline photovoltaic cell technology these particles may include all metals having properties as conductors, such as Ni, Au, Al, Ag, Mo, Cu, Pt and Pd; transparent conductors, such as ZnO, and SnO$_2$ often used in contact grid layers.

Either the particles and the organometallic chelates or both, may be combined with an organic solvent prior to printing. In combination, the solvent is useful to suspend the constituents to provide inks of a suitable viscosity for direct printing. The solvent, when used, is preferably toluene, but the use of other solvents, such as an alcohol, is specifically contemplated herein.

The ink is direct written on any suitable surface or substrate, preferably with a pressure spray or ink jet deposition process. Suitable substrates include, for example glass, carbon, silicon, silica, alumina, boria, titania, or thermally stable polymers such as aramids, carbonates, esters, and the like. Preferably, the substrate is silicon, glass, Kapton, or the ZnO layer of a CIS solar cell.

Following printing, the ink is decomposed wherein it consolidates into a well bonded conductor. Decomposition may be by heat or phytolytic action. When heating, decomposition of silver and gold conductors can occur in air, or alternatively, in nitrogen for silver conductors. Heating is preferably carried out at less than 300° C., and more preferable in the range of 230° to 280° C. It is also preferred that decomposition occur in the least amount of time, and more desirably in two minutes or less. It is understood that decomposition temperatures and environmental parameters vary greatly, depending upon the conductor to be formed, and that these kinetics are well known. For example, a detailed discussion of some of the reaction kinetics is provided in U.S. Pat No. 5,882,722, which is incorporated herein by reference.

When a solvent is used, no preliminary evaporation step is necessary in the formation of the conductors of the present invention, nor is there any need to introduce the printed substrate into a cold oven and then ramp the temperature, after printing, to first drive off the solvent and then decompose the ink at an optimum temperature. Thus, the entire decomposition step is carried out at the decomposition temperature, either with or without the inclusion of a solvent or metal particles in the ink. The process herein thereby directly writes an ink which sinters into a high definition conductor, and which may be used in the formation of line widths less than 100 microns, having a grain size in the range of 50 to 200 microns. The conductors are durable even when applied at a thickness of much more than 1 micron.

The examples which follow describe various embodiments of the process of the present invention and demonstrate that by using the process well formed conductors are formed, while eliminating process steps in use with conventional methods, such as CVD and screen printing. Briefly, in the examples, the organometallic complex is applied under pressure, either alone or in combination with metal nanoparticles, a solvent, or both under pressure and directly decomposed to form electrical conductors at a temperature of less than 400° C. Moreover, direct-writing of Cu conductors at plastic-compatible temperatures (i.e., 230° C.) in a nitrogen-only gas ambient is demonstrated. Owing to the low viscosity of Cu(hfa).VTMS, this complex is amenable to direct-written 100 µm Cu linewidths by ink jet printing onto heated to substrates.

EXAMPLE 1

The following example demonstrates the application of organometallic silver inks in the direct write process. Organometallic inks derived from Ag(hfa)(L) complexed, where L=SEt$_2$, or 1,5=cyclooctidiene (COD), were used to deposit Ag films on glass and Si substrates using a 15 spray printing process. The ink was prepared by dissolving Ag(hfa)(SEt$_2$) (2.0 g) in toluene (2.3 g) and forcing the resulting solution through a syringe filter. This ink was sprayed in several coats onto heated substrates using a hand-held sprayer (Paasche Type BL Airbrush) in a N$_2$-filled glove box. In FIG. 1 SEM images are shown of Ag films sprayed on glass and Si substrates at 275°–400° C. In the figure, the films are smooth and dense with a thickness ranging from 0.8 to 1.5 µm (Dektak3 profilometer). Surface resistance measurements performed by 4-point probe gave a resistivity of ~2 µΩ·cm for both of these films, near that for evaporated silver. XPS data as a function of depth for a Ag film spray printed with Ag(hfa)(COD) ink shows C, O and F present in substantial amounts at the surface, but these levels fell rapidly within the top 30 angstroms. No O or F was found at 50 angstroms, and the C concentration fell from 2 to 1 atom % between 100 and 300 angstroms deep. Smooth Ag films with a thickness of ~1 µm and excellent resistivities were thus decomposed and bonded in a singe low temperature step at atmospheric pressure using these organometallic inks. The inks arc also amenable for printing onto hot substrates using an ink-jet print head.

EXAMPLE 2

Figure 2A:
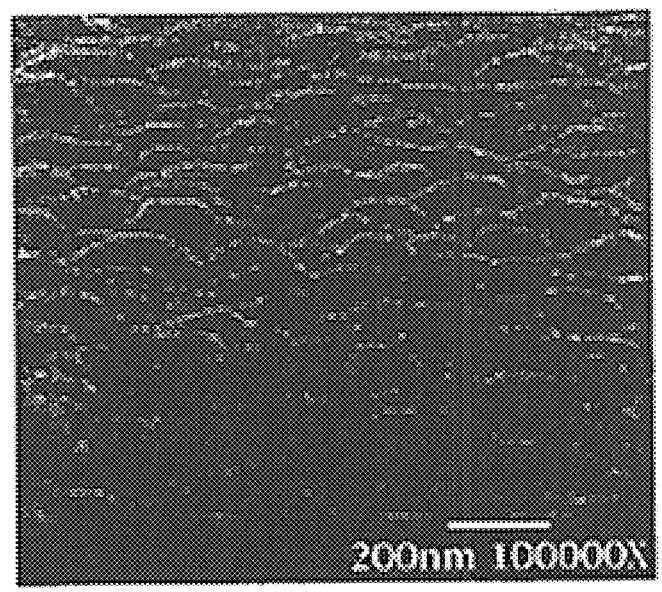
FIG. 2a is an SEM photograph of a copper conductor on glass substrate. The conductor was spray printed at $T_{dep}$=230° C. using a Cu(hfa).VTMS ink.
Figure 2B:
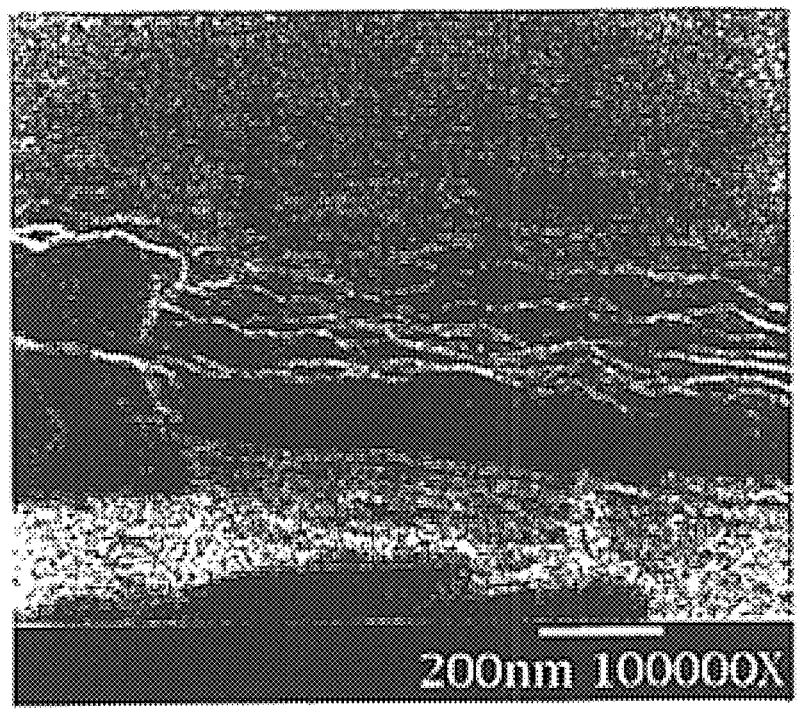
FIG. 2b is an SEM cross-section analysis of an edge of the film of FIG. 2a. The SEM shows that the Cu film is quite dense having little evidence of grain boundary structure.

Standard Schlenk techniques, Shriver, D. F., et at., *The manipulation of Air-Sensitive Compounds*, 2$^{nd}$ ed., Wiley-Interscience: New York, 1986, 78, were used for isolation and manipulations with spray printing performed in a nitrogen-purged PlasLab glovebox. Cu(hfa).VTMS, a dark-yellow low-viscosity liquid, was synthesized based on Doyle, F., et al., *Organometallics* 1985, 4, 830, and contained no impurities as evidenced by $^1$H nmr. Deposition temperature (T$_{dep}$) was observed to be a key variable in the growth of these adherent Cu films. T$_{dep}$ from 100–200° C. gave powdery, non-adherent deposits on glass microscope slides. However, increasing T$_{dep}$ to 220–230° C. yielded shiny deposits that passed the Scotch tape test and were confirmed to be copper metal by X-ray diffraction (PDF # 4–836). The morphology of these spray printed copper films was determined using scanning electron microscopy (SEM). FIG. 2a shows an SEM photograph of one copper on glass film spray printed at T$_{dep}$=230° C., using a Cu(hfa).VTMS ink. A contiguous film was observed with constituent surface features on the order of 50–200 nm in diameter. Referring now to FIG. 2b, an SEM cross-section analysis of an edge of this film shows that the Cu film was quite dense with little evidence of grain boundary structure. This result, was unlike that reported for the formation of Cu on $SiO_2$ films by chemical vapor deposition (CVD) using a Cu(hfa).VTMS precursor where porous, large-grained microstructures were observed at $T_{dep} \geq 230°$ C. See. e.g., Chiou, J. C., et al., *Electron, Mater.* 1994, 23, 383; Yoon, S. S., et al., *J. Mater. Sci.* 1995, 30, 2029. A distinct difference between these CVD literature reports and the present invention is the deposition pressure, which was ~1 torr in the CVD process and ~700 torr in the example herein. In the figure the higher deposition pressure may have resulted in very small crystallites and it is believed that the surface shown was a consequence of the size of the aerosol droplets produced by the sprayer.

Figure 3:
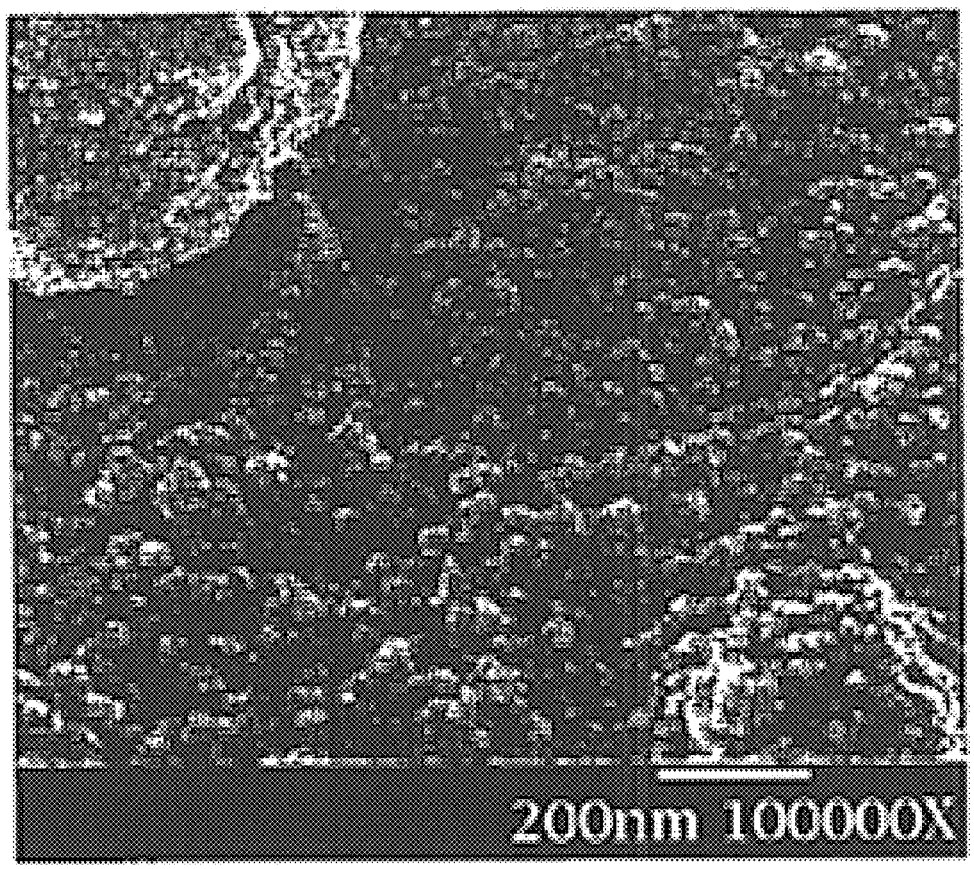
FIG. 3 is an SEM image of a Cu film deposited on Kapton tape at $T_{dep}$=230° C. The Figure shows that the surface morphology of this Cu on the Kapton film is similar to that which was observed for the Cu on glass film of FIG. 2a. The thickness of this film was ~750 nm.

Spray printing of Cu layers using Cu(hfa).VTMS was also realized on a polymer substrate. Turning now to FIG. 3, an SEM image of the Cu film that deposited on Kapton tape, at $T_{dep}=230°$ C., illustrates that the surface morphology of this Cu on Kapton film is similar to that which was observed for the Cu on glass film shown in FIG. 2a. The thickness of this film was ~750 nm.

EXAMPLE 3

The electrical properties of the copper films were determined by standard 4-probe measurements. Owing to high conductivity, it was necessary to reduce the linewidths of the copper films prior to this characterization. For simplicity, this was accomplished using Kapton tape masks. First, a piece of Kapton tape (~25 mm wide by ~50 mm long) was carefully placed over the length of a glass nicroscopy slide. Each end of the tape (i.e., tab) was temporarily attached to the top of a clean laminar flow bench. Next, a new, cleaned razor blade was used to scribe lengthwise lines through the Kapton tape. Finally, alternating strips of tape were removed giving the Kapton-masked glass substrates used in this study. These substrates were then transferred into a spray booth and mounted onto a temperature-controlled hot plate using the Kapton tabs.

After spray printing, the films were removed from the spray booth and exposed to atmosphere air. Copper on glass films were prepared, for electrical characterization, by removing the remaining Kapton strips, and connecting Au wire electrodes in four probe position using Ag paint. Copper on Kapton films were prepared by scribing two parallel lines along the length of the Kapton strip, and removing the satellite strips (to ensure electrical isolation) and connecting Au wire/Ag paint electrodes. After 4-probe resistance measurement, film thickness and line width was measured between the voltage pads using a stylus profilometer. The uncertainty in thickness was rather large in the experiments owing to the curvature of the glass and Kapton on glass substrates. The conducting properties of copper films spray printed using Cu(hfa).VTMS ink are summarized in Table 1.

TABLE 1

Characterization Data of Spray Printed Thin Films

| Film (mm) | Precursor | Solvent | $T_{dep}$(° C.) | Substrate | $\rho(\mu\Omega \cdot cm)$ | Thickness (nm) Width |
|---|---|---|---|---|---|---|
| Cu | Cu(hfa) · VTMS 4.0 + 0.1 | None | 230 | Glass | 24 ± 14 | 350 ± 200 |
| Cu | Cu(hfa) · VTMS 0.7 + 0.1 | None | 230 | Glass | 49 ± 19 | 520 ± 200 |
| Cu | Cu(hfa) · VTMS 3.4 + 0.1 | None | 230 | Kapton | 1600 ± 430 | 750 ± 200 |
| Ag | [Ag(hfa)]$_2$ · H$_2$O 3.8 + 0.1 | Toluene | 280 | Glass | 290 ± 180 | 1600 ± 100 |

The observed best conductivity values for copper on glass were on an order of magnitude lower than that for bulk copper, as well as, the various reports of $\rho \sim 2\,\mu\Omega \cdot cm$ by CVD using Cu(hfa).VTMS. It is believed that this result was a consequence of Cu(hfa).VTMS impurities, borosilicate substrate outdiffusion, or microcracking of the films during Kapton mask removal (thus, reducing line width). Finally, it was also demonstrated that analogous spray printing of [Ag(hfa)]$_2$.H$_2$O in toluene ink onto glass also gave conducting lines.

EXAMPLE 4

One conducting thin-film, formed according to the method of the present invention, is a composite nickel contact useful in the fabrication of CIS solar cells. Here, a mixture of nickel nanoparticles (less than 10 nm), and metal chelates, such as Ni(cyclooctadiene)$_2$, were spray deposited on a substrate. Thermal decomposition of the metal chelates caused the formation and annealing of a conducting matrix of particles and metallic complex decomposition products.

Figure 4:
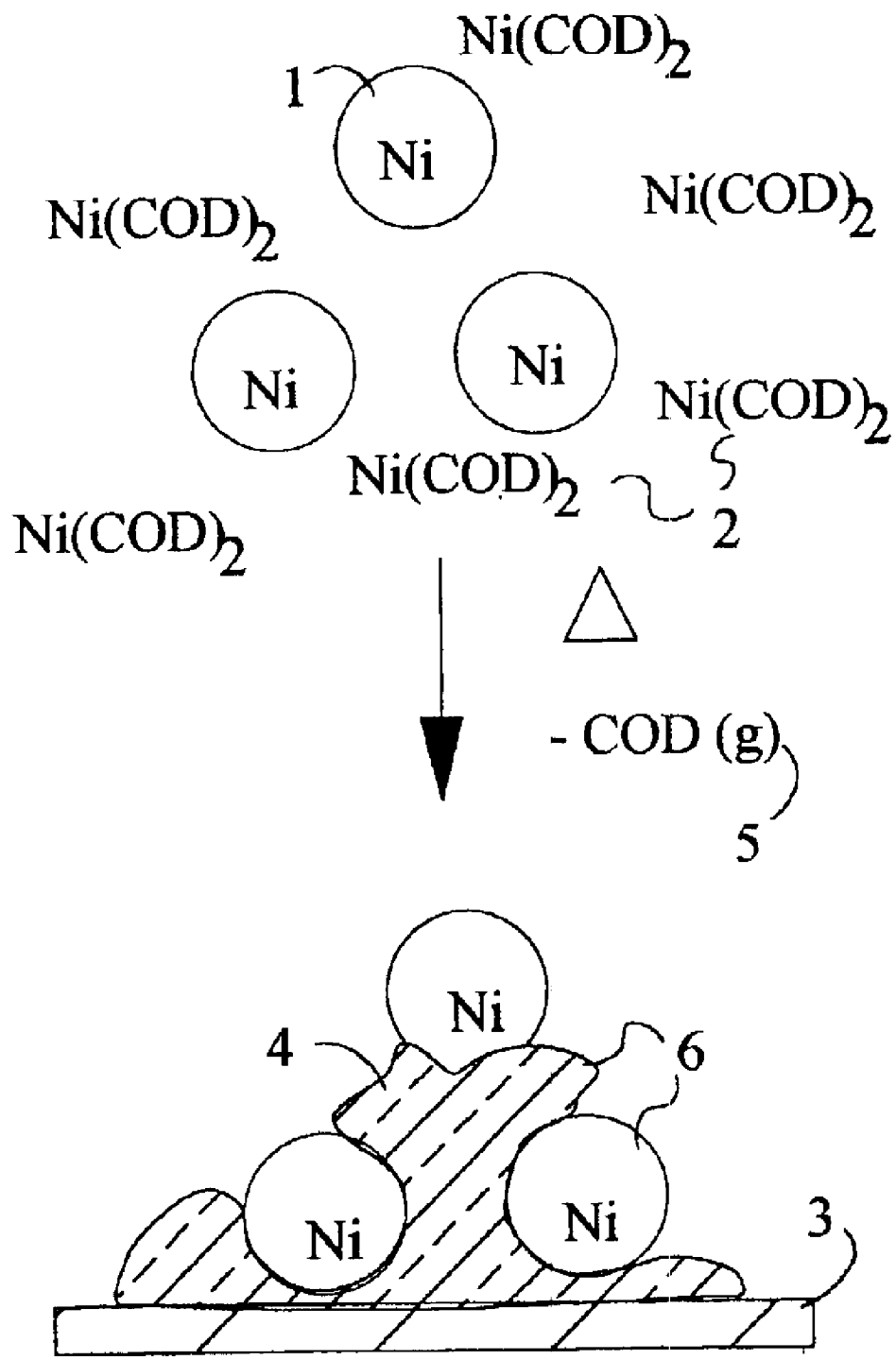
FIG. 4 is a schematic of processing steps used to generate a Ni thin-film on a ZnO substrate in a direct write process using an ink comprising Ni nano particles, a metal chelate, and an organic solvent.

FIG. 4 is an illustration of the process wherein the ink comprises a solvent, nanoparticulate metals, and a metal chelate in accordance with another embodiment of the present invention. In the Figure, it is shown a general schematic drawing of the processing steps used to generate a nickel conductor film having electrical conductivity and structural connectivity to a ZnO layer in CIS solar cells. In FIG. 4, a mixture was prepared comprising Ni particles (~6 nm) 1 and meta-chelate complex 2, in a solvent. Metal-chelate 2 is Ni (cyclooctadiene)$_2$(Ni(cod)$_2$ in the drawing)) in a tetrahydrofuran solvent. The mixture was spray or ink jet printed onto substrate 3, such as the ZnO overlayer in a CIS solar cell. The substrate was heated above the decomposition temperature of the chelate complex 2 whereby chelate complex 2 decomposes to form Ni metallic decomposition products 4 and volatile cyclooctadiene 5 and consolidates into the conductor. Stable composite conducting assemblage, shown generally as 6, was thereby formed as an electrically conducting film on substrate 3. Careful control of the annealing ambient was an important factor in the decomposition phase to ensure formation of the desired products. For example, the thermal decomposition of a metal-chelate complex under nitrogen, hydrogen, or nonflammable hydrogen and nitrogen mixture gas (10%H$_2$ makeup N$_2$), may result in the metallic product phase while decomposition in air or oxygen could give rise to a metal oxide. The use of metal-chelates that are readily decomposed using photons (that is, photochemical decomposition) provides an alternative route to thermal decomposition.

While the present invention has been described and illustrated in detail, it is clearly understood that the same is by way of illustration and example only and is not to be taken by way of limitation, the spirit and scope of the present invention being limited only by the terms of the appended claims.

What is claimed is:

1. A process for forming an electrical conductor on a substrate, consisting essentially of:
   (a) providing an ink comprising a metallic chelate, the metallic chelate having at least one constituent selected from the group consisting of: hfa, COD, VTMS, tetraglyme, diglyme, SEt$_2$, and trimethylphosphine;
   (b) printing the ink directly on the substrate; and
   (c) decomposing the ink wherein the metal-chelate is converted to a solid metal conductor on the substrate.

2. The process of claim 1 wherein the ink further comprises at least one constituent selected from the group consisting of a binder, a stabilizer, and both a binder and a stabilizer.

3. The process of claim 1 wherein the ink is printed at a pressure in the range of 200 to 700 torr.

4. The process of claim 1 wherein the metal conductor has a line width less than 100 microns.

5. The process of claim 1 wherein the metal conductor has a grain size in the range of 50 to 200 nm.

6. The process of claim 1 wherein the metal conductor has a thickness less than 1 micron.

7. The process of claim 1 wherein the metal is selected from the group consisting of copper, silver, gold, aluminum and nickel.

8. The process of claim 1 wherein the metal-chelate is selected from a group consisting of metal β-diketonates, metal amides, metal organometallics and metal alkoxides.

9. The process of claim 1 wherein the metal-chelate is Cu(hfa).VTMS, [Ag(hfa)(diglyme)]$_2$, Ag(hfa)(COD) or ethyl(trimethlyphosphine)gold(I).

10. The process of claim 1 wherein decomposing the metal-chelate is by heating in an atmosphere selected from the group consisting of nitrogen and air at a temperatures less than 400° C.

11. The process of claim 1 wherein the ink further comprises metallic particles having a size in the range of 1 to 10 nm.

12. The process of claim 1 wherein the substrate is Kapton.

13. The process of claim 11 wherein the particles are selected from a group consisting of copper, silver, or and gold.

14. The process of claim 11 wherein the ink further comprises a solvent.

15. The process of claim 11 wherein the metal-chelate is selected from a group consisting of metal β-diketonates, metal amides, metal organometallics and metal alkoxides.

16. The process of claim 11 wherein the metal chelate is selected from a group consisting essentially of Cu(hfa). VTMS, Ag(hfa).tetraglyme, and ethyl(trimethlyphosphine) gold(I).

17. The process of claim 11, wherein decomposing is by heating in an atmosphere selected from the group consisting of air an nitrogen at temperatures less than about 300° C.

18. The process of claim 14 wherein the solvent is toluene.

19. The process of claim 14 wherein decomposing is by heating in an atmosphere selected from the group consisting of air and nitrogen at temperatures of less than 300° C.

20. The process of claim 14 wherein the particles are selected from a group consisting of copper, silver, and gold.

21. The process of claim 14 wherein the metal-chelate is selected from a group consisting of metal β-diketonates, metal amides, metal organometallics and metal alkoxides.

22. The process of claim 14 wherein the metal chelate is selected from a group consisting essentially of Cu(hfa). COD, Cu(hfa).VTMS, [Ag(hfa)]$_2$.H$_2$O, Ag(hfa).tetraglyme, [Ag(hfa)(diglyme)]$_2$, Ag(hfa)(COD), Ag(hfa)(SEt$_2$) and ethyl(trimethlyphosphine)gold(I).

* * * * *